United States Patent [19]
Moller et al.

[11] Patent Number: 5,889,319
[45] Date of Patent: *Mar. 30, 1999

[54] RF POWER PACKAGE WITH A DUAL GROUND

[75] Inventors: Thomas W. Moller, Gilroy; Larry Leighton, Santa Cruz, both of Calif.

[73] Assignee: Ericsson, Inc., Morgan Hill, Calif.

[*] Notice: This patent issued on a continued prosecution application filed under 37 CFR 1.53(d), and is subject to the twenty year patent term provisions of 35 U.S.C. 154(a)(2).

[21] Appl. No.: 684,474

[22] Filed: Jul. 19, 1996

[51] Int. Cl.$^6$ .............................. H01L 23/52; H01L 23/12
[52] U.S. Cl. ..................... 257/691; 257/706; 257/717; 257/732; 257/774
[58] Field of Search .................... 257/691, 732, 257/774, 771, 776, 712, 717

[56] References Cited

U.S. PATENT DOCUMENTS

| | | | |
|---|---|---|---|
| 3,649,872 | 3/1972 | Garboushian | 317/234 K |
| 3,713,006 | 1/1973 | Litty et al. | 317/101 |
| 3,958,195 | 5/1976 | Johnson | 333/84 |
| 4,032,964 | 6/1977 | Boeters | 257/732 |
| 4,042,952 | 8/1977 | Kraybill | 357/68 |
| 4,193,083 | 3/1980 | Max | 357/80 |
| 4,200,880 | 4/1980 | Frey | 357/51 |
| 4,213,141 | 7/1980 | Colussi | 357/74 |
| 4,495,515 | 1/1985 | Pamiello | 257/732 |
| 4,604,643 | 8/1986 | Yotsumoto et al. | 257/732 |
| 5,170,337 | 12/1992 | Borowiec | 363/147 |
| 5,239,198 | 8/1993 | Lin et al. | 257/693 |
| 5,406,125 | 4/1995 | Johnson et al. | 257/774 |

FOREIGN PATENT DOCUMENTS

| | | | |
|---|---|---|---|
| 157505 | 10/1985 | European Pat. Off. | 257/732 |
| 2154939 | 9/1985 | United Kingdom | 257/732 |

*Primary Examiner*—David Ostrowski
*Attorney, Agent, or Firm*—Lyon & Lyon LLP

[57] ABSTRACT

An RF power transistor package is configured for mounting to a heat sink in a multi-layer pc board, and includes a direct top side electrical ground path from a transistor chip located atop a ceramic substrate to a mounting flange, without passing through the ceramic substrate by way of metal plating an outer surface of the ceramic substrate to electrically connect a top mounted metal lead to the flange. A direct ground path from the transistor chip to the mounting flange is also provided by way of plated via holes through the ceramic substrate. The top side ground path is also configured to connect with the middle ground reference layer of the multi-layer pc board when the mounting flange is secured to the heat sink, so that a unified ground potential is seen by the transistor at both the middle layer and heat sink. In this manner, the power transistor package is grounded at the same reference potential as other elements attached to the pc board, while still having the high performance characteristics provided by the ground path via holes.

9 Claims, 2 Drawing Sheets

RF POWER PACKAGE WITH A DUAL GROUND

FIELD OF THE INVENTION

The invention pertains to electrical grounding of radio frequency power transistor packages.

BACKGROUND

Radio Frequency ("RF") power transistors have many uses in industries ranging from communications to consumer electronics, e.g., for use as high frequency amplifiers. Such transistors are commonly designed for attachment to a printed circuit ("pc") board, to be used in conjunction with other circuit components mounted on the same pc board.

Typically, one or more transistor cells are fabricated on a silicon wafer (referred to as a transistor "chip"). The transistor chip is then attached to an insulating layer, normally a ceramic substrate. The ceramic substrate is itself attached to a mounting flange, and a protective cover is placed over the substrate and transistor chip, thereby forming a component transistor "package." Various electrically conductive (e.g., metal) leads are attached to, and extend away from the package (i.e., outside the protective cover) to connect common terminals of the transistor chip to external circuit elements, e.g., located in a pc board along with the transistor package. For example, in a bipolar junction type transistor, respective electrical leads attached to the package are connected to a base, emitter and collector of the transistor chip.

Single layer pc boards—i.e., where there is a single layer of dielectric material between respective top and bottom surfaces of the board,—typically have a metallic bottom surface which is also a reference ground. This bottom surface is connected, usually with screws or solder, to a (metallic) heat sink, so that the bottom of the pc board and the heat sink have the same ground potential with respect to any circuit elements attached to the pc board.

One of two methods is used to connect the transistor package to ground in a single layer pc board. A first method is to provide a "top side" ground, wherein one or more grounding wires connect respective emitter, base or collector pads of the transistor chip to a "ground plane" (also known as a "ground bar"), which is normally attached to the ceramic substrate adjacent the transistor chip. The ground plane is electrically part of a metal lead frame extending from the package. After the package is mounted to the heat sink, the lead frame may be soldered or otherwise connected (e.g., by a wire clip arrangement) to the top of the respective pc board, wherein an electrical path to ground (i.e., the bottom surface of the board) is provided. Although a ground path is achieved by this method, it is not necessarily of uniform length from each of the common emitter (or base) locations.

Another method for grounding RF transistor packages in a single layer pc board is through the use of plated "via holes" located in the ceramic substrate. In particular, the via holes extend from a top surface of the ceramic substrate to a top surface of the mounting flange and are plated with an electrically conductive material, e.g., metal, thereby allowing current to flow through them. Again, one or more grounding wires connect respective emitter, base or collector pads of the transistor chip to a ground plane. The ground plane is provided directly over, and is in electrical contact with the via holes, so that current passes from the ground plane, through the via holes, to the mounting flange. The mounting flange is then connected, usually by screws, to the metal heat sink, which, as noted above, is an equivalent potential as the board's bottom surface. Proper spacing of the via holes is desirable so that each emitter, base or collector pad of the transistor chip is located approximately the same electrical distance to ground potential, and thereby reduce unwanted inductance.

Of the aforedescribed grounding methods for single layer pc boards, the via holes are generally considered superior from a performance perspective, because the electrical path to ground (e.g., the heat sink surface) is more direct and uniform over the entire transistor device. On the other hand, where performance requirements will allow, the top side "lead frame" method is perferred, as it is less costly to manufacture the packages without the via holes.

With the need to reduce component size, amplifier designers are being forced to develop RF power transistor packages for multi-layer pc boards, wherein proper grounding becomes more difficult. In particular, in a multi-layer pc board, there are at least two, and often more layers of dielectric insulating material between the respective bottom and top surfaces of the pc board, with an additional metallic layer located between two of the dielectric layers. This additional metallic layer acts as ground reference for certain components mounted on the top surface of the pc board. Thus, when the bottom of the board is mated with a heat sink, there are two ground planes:—the metal layer between the dielectric layers of the pc board, and the heat sink. While these two ground planes are connected, components mounted to the top surface of the pc board will still "see" the ground plane of the middle metallic layer much more so than the ground plane of the heat sink surface.

When an amplifier designer is required to use an RF power transistor in a multi-layer pc board whose performance requirements would otherwise require the use of plated via holes for grounding, i.e., in order to minimize common lead inductance over the ground path, there is a problem in that the RF power transistor will use as the predominant ground plane the heat sink, to which it is directly attached, whereas the other circuit elements mounted to the board will use the middle metallic layer as the predominant ground plane.

In particular, the RF power transistor operates at very high frequencies, which can result in an undesirable isolation between the two ground planes. This isolation can prevent high frequency components of the transistor current from flowing from the middle metal layer to the heat sink bottom of the pc board. This, in turn, causes the transistor to "see" a different voltage at the middle metal layer than at the heat sink. Having different reference voltages for various electrical components in the same pc board can lead to instabilities, poor production yields and generally lower reliability.

Thus, it is a desirable objective to provide a grounding method for an RF transistor power package designed for use in a multi-layer pc board and, in particular, with minimal common lead inductance between the package and the supporting circuitry.

SUMMARY OF THE INVENTION

The present invention overcomes the aforedescribed limitations of prior art grounding techniques by providing a RF power transistor package having multiple paths to ground for transistor current.

In a preferred embodiment, an RF power transistor package is configured for mounting to a heat sink in a multi-layer pc board having a middle ("ground reference") layer. In particular, the package includes a direct top side electrical ground path from a transistor chip located atop a ceramic substrate to a mounting flange, without passing through the ceramic substrate. Perferably, this top side ground path is provided in a manner which minimizes common lead inductance between the respective transistor chip elements and the mounting flange. For example, in some preferred embodiments, an outer surface of the ceramic substrate is metal plated in order to electrically a top mounted metal lead frame to the flange. In alternate preferred embodiments, symmetrically disposed metal connectors connect respective lead frame tabs and the flange. A direct ground path from the transistor chip to the mounting flange is also provided by way of plated via holes through the ceramic substrate.

In accordance with a general aspect of the invention, the top side ground path is also configured to connect with the middle ground reference layer of the multi-layer pc board when the mounting flange is secured to the heat sink. Thus, a unified ground potential is seen by the transistor at both the middle layer and heat sink—i.e., by way of the top side ground path being connected to both the heat sink and middle ground layer. In this manner, the preferred power package configuration is grounded at the same reference potential as the other elements attached to the pc board, while still having the high performance characteristics provided by the ground path via holes.

This and other aspects, objects, advantages and features of the present invention will be more fully understood and appreciated by those skilled in the art upon consideration of the following detailed description of a preferred embodiment, presented in conjunction with the accompanying drawings.

BRIEF DESCRIPTION OF THE DRAWINGS

The drawings illustrate both the design and utility of perferred embodiments of the present invention, in which.

DETAILED DESCRIPTION OF THE PREFERRED EMBODIMENTS

Figure 1:
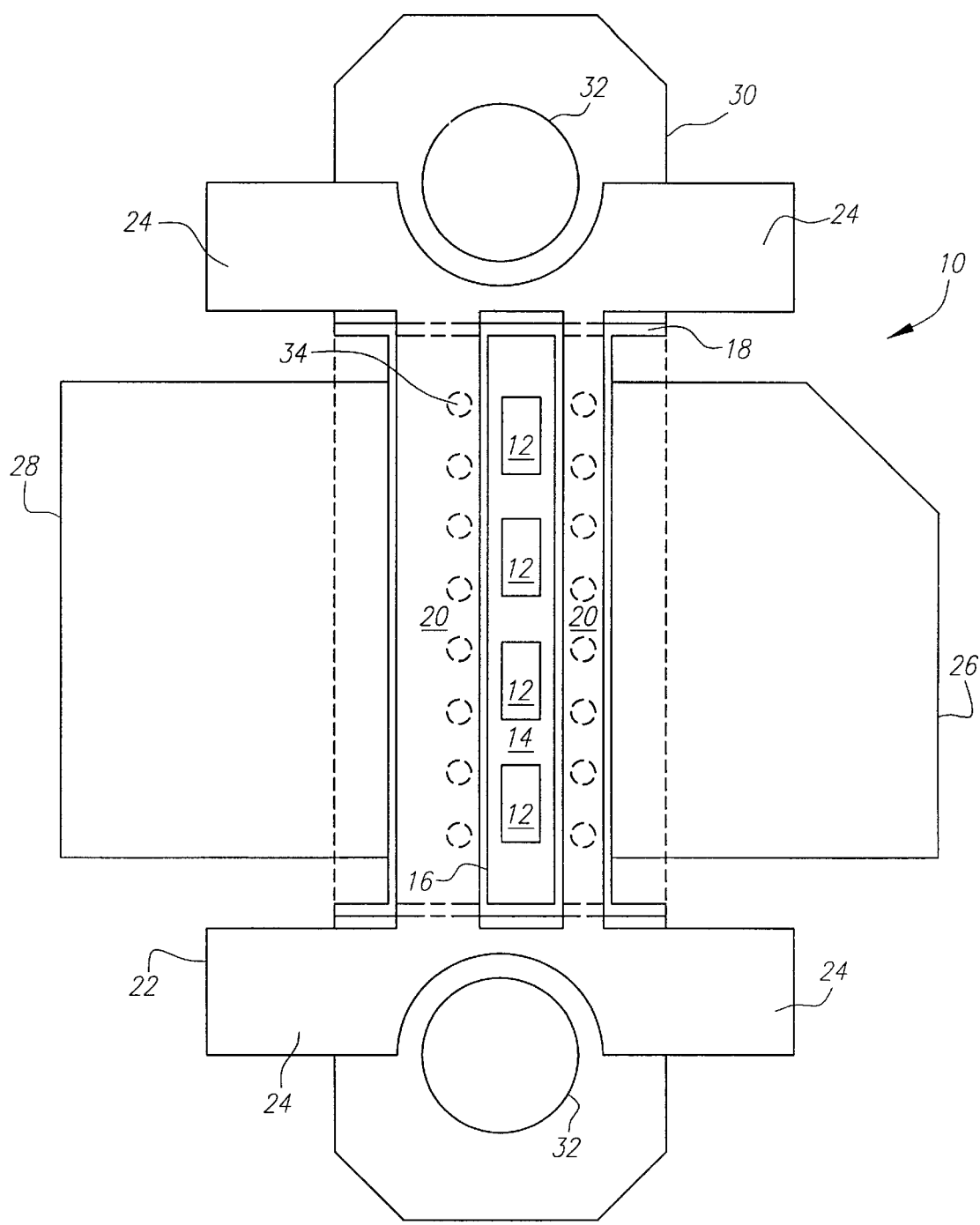
FIG. 1 is a top view of a preferred RF power transistor package, according to a first aspect of the present invention.

Referring to FIG. 1, an RF power transistor package 10 includes a plurality of transistor cells 12 fabricated on a silicon die 14, thereby forming a transistor chip 16. The transistor chip 16 is attached to a top surface of a non-conductive substrate 18, which is preferably an electrically isolating, but thermally conductive ceramic compound, such as, e.g., beryllium oxide. Also attached to the top surface of substrate 18 are one or more ground bars 20, which collectively act as a common ground plane for the cells 12 of the transistor chip 16. In particular, a first plurality of wires (not shown) connect common "ground" (i.e., emitter or base) terminals (not shown) of the respective transistor cells 12 to the ground bar(s) 20.

A common (i.e., base or emitter) lead 22 is attached to, and extends outward from, respectively, the top surface of non-conductive substrate 18, wherein the common lead 22 is electrically connected to the ground bar(s) 20. The common lead 22 includes a four respective "tabs" 24, which extend outward from the non-conductive substrate 18 in a dispersed, preferably symmetrical fashion, and are configured to make electrical contact with one or more ground leads (not shown) disposed on a top surface of a pc board (not shown) to which the package 10 is attached.

An output (collector) lead 26 is also attached to, and extends outward from, respectively, the top surface of non-conductive substrate 18, wherein the output lead 26 is connected by a second plurality of wires (not shown) to one or more output (collector) terminals (not shown) of the respective transistor cells 12. An input (i.e., base or emitter) lead 28 is also attached to, and extends outward from, respectively, the top surface of non-conductive substrate 18, wherein the input lead 28 is connected by a third plurality of wires (not shown) to one or more input (i.e., base or emitter) terminals (not shown), respectively, of the transistor cells 12.

Figure 2:
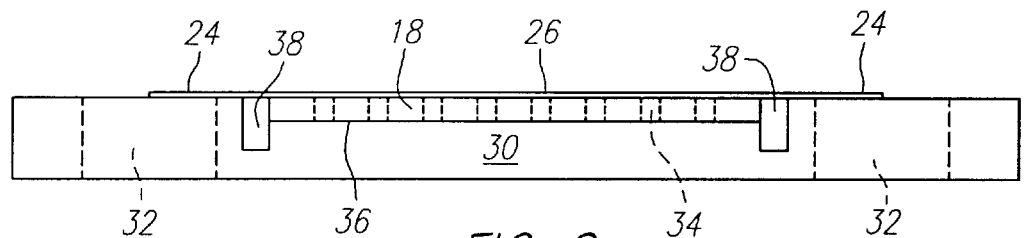
FIG. 2 is a side view of the RF power transistor package of FIG. 1.

As best seen in FIG. 2, a bottom surface of the non-conductive substrate 18 is attached to a conductive mounting flange 30, which is adapted to be securably mounted to a heat sink (not shown) in a pc board configuration (not shown), e.g., by metal screws (not shown) secured through respective screw holes 32. A plurality of conductively plated via holes 34 extend between the respective top and bottom surfaces of the non-conductive substrate 18, wherein the respective via holes 34 form a first electrical path from the common ground plane (i.e., ground bar(s) 20) to the mounting flange 30.

Figure 3:
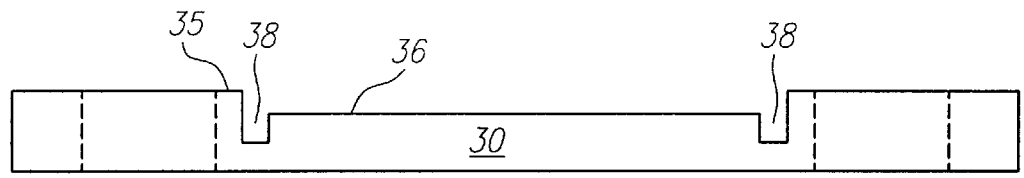
FIG. 3 is a side view of the mounting flange of the RF power transistor package of FIG. 1.

As best seen in FIG. 3, a groove or "well" 36 is formed in a surface 35 of the mounting flange 30, to which the non-conductive substrate 18 is attached. The well 36 preferably provides for open, (i.e., non-contact) areas 38 on either side of substrate 18, to relieve thermal stress during the manufacturing process, i.e., caused by different thermal expansion coefficients in the respective non-conductive substrate 18 and flange 30 materials.

In accordance with one aspect of the invention, well 36 is configured to "seat" the non-conductive substrate 18 in at depth such that a portion of each of the tabs 24 of the common lead 22 extends on a substantially even plane as, and makes electrical contact with, respectively, flange surface 35. In this manner, a second electrical path is formed between the common ground plane (ground bar(s) 20) and mounting flange 30, wherein the second electrical path is externally located with respect to the non-conductive substrate 18.

Figure 4:
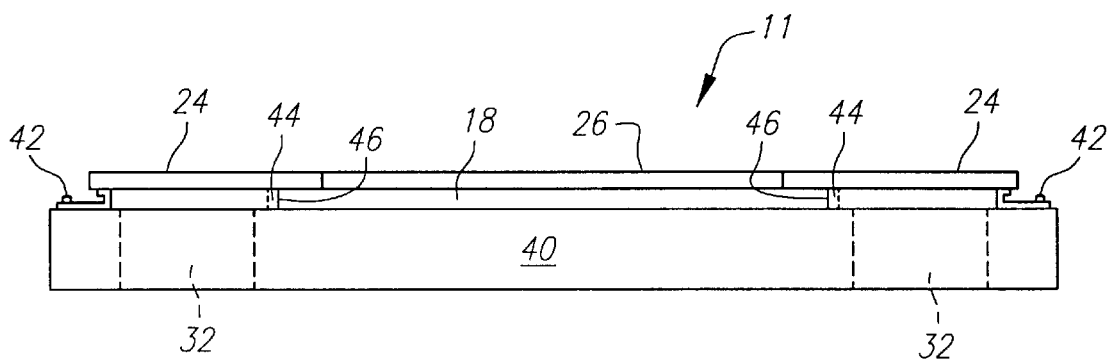
FIG. 4 is a side view of an alternate preferred RF power transistor package, in accordance with further aspects of the present invention.

Referring to FIG. 4, in an alternate preferred embodiment of the transistor package 11, a mounting flange 40 is not provided with a well 36, but instead retains a substantially rectangularly shaped cross-section. In this instance, a second ground path for transistor current to reach the mounting flange 40 may be provided by conductive connectors 42 which extend between each of the respective common lead tabs 24 and the mounting flange 40. Although a single conductive connector 42 between only one of the tabs 24 and flange 40 will provide a ground current path, it is perferred to employ a connector 44 between each respective tab 24 and mounting flange 40 in order to reduce common lead inductance over the established ground path.

Alternately, a second ground path between the respective common lead tabs 24 and mounting flange 40 may be provided by a conductive coating 44, e.g., such as metal plating, covering one or both end surfaces 46 of the non-conductive substrate 18, depicted with dashed lines in FIG. 4 to indicate it is an alternate preferred ground path.

Thus, preferred embodiments have been disclosed of a RF power transistor package configuration having multiple paths to ground for transistor chip 16 current. While embodiments and applications of this invention have been shown and described, as would be apparent to those skilled in the art, many more modifications and applications are possible without departing from the inventive concepts herein.

The scope of the inventions, therefore, are not to be restricted except in the spirit of the appended claims.

What is claimed:

1. An RF power transistor package, comprising:
   a transistor chip having one or more ground terminals connected to a common ground plane, wherein the transistor chip and common ground plane are each attached to a first surface of a non-conductive substrate;
   a conductive mounting flange configured for attachment to a heat sink, wherein a second surface of the non-conductive substrate is attached to the flange, the substrate having a plurality of conductively plated via holes extending between the respective first and second surfaces and forming a first electrical path from the common ground plane to the flange;
   a conductive lead coupled to the first surface of the substrate and coupled to the common ground plane; and
   a second electrical path connecting the lead to the flange, the second electrical path located external to the non-conductive substrate.

2. The RF power transistor package of claim 1, the flange having a well disposed in a first surface and configured for seating the non-conductive substrate such that a portion of the lead extends from the substrate on a substantially even plane as the flange surface.

3. The RF power transistor package of claim 2, wherein the lead is in direct contact with the flange.

4. The RF power transistor package of claim 1, the second electrical path comprising conductive plating disposed over a third surface of the non-conductive substrate.

5. The RF power transistor package of claim 1, the second electrical path comprising a conductive connector disposed between the respective lead and flange.

6. The RF power transistor package of claim 1, the second electrical path comprising a plurality of conductive connectors disposed between the respective lead and flange.

7. The RF power transistor package of claim 1, the lead configured to make electrical contact with a ground lead disposed on a top surface of a pc board to which the package is attached.

8. An RF power transistor package, comprising:
   a transistor chip having one or more ground terminals connected to a common ground plane, wherein the transistor chip and common ground plane are each attached to a first surface of a non-conductive substrate;
   a conductive mounting flange configured for attachment to a heat sink, wherein a second surface of the non-conductive substrate is attached to the flange, the substrate having a plurality of conductively plated via holes extending between the respective first and second surfaces and forming a first electrical path from the common ground plane to the flange;
   a conductive lead extending from the first surface of the substrate and connected to the common ground plane; and
   conductive plating disposed over a third surface of the non-conductive substrate and forming a second electrical path from common ground plane to the flange,
   wherein the lead is configured to make electrical contact with a ground lead disposed on a top surface of a pc board to which the package is attached.

9. The RF power transistor package of claim 8, the flange having a well configured for seating the non-conductive substrate such that a portion of the lead extends on a substantially even plane with, and is connected to, respectively, the flange.

* * * * *